United States Patent
Guo et al.

(10) Patent No.: US 10,693,361 B2
(45) Date of Patent: Jun. 23, 2020

(54) FAULTY CURRENT SENSE LINE DETECTION IN MULTIPHASE VOLTAGE REGULATORS

(71) Applicant: Infineon Technologies Austria AG, Villach (AT)

(72) Inventors: Jinghong Guo, Shanghai (CN); Harrison Hu, Guangdong (CN); Tim Ng, Monterey Park, CA (US); Mattia Oddicini, Redondo Beach, CA (US); Benjamim Tang, Rancho Palos Verdes, CA (US); Herbert Zojer, Torrance, CA (US)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 16/051,762

(22) Filed: Aug. 1, 2018

(65) Prior Publication Data
US 2020/0044553 A1 Feb. 6, 2020

(51) Int. Cl.
*H02M 3/158* (2006.01)
*H02M 1/00* (2006.01)
*G01R 31/50* (2020.01)
*H02H 1/00* (2006.01)
*H02H 7/12* (2006.01)
*H02M 1/36* (2007.01)

(52) U.S. Cl.
CPC ............. *H02M 1/00* (2013.01); *G01R 31/50* (2020.01); *H02H 1/0007* (2013.01); *H02H 7/1213* (2013.01); *H02M 3/1584* (2013.01); *H02M 1/36* (2013.01); *H02M 2001/0009* (2013.01)

(58) Field of Classification Search
CPC ............. H02M 3/1584; H02M 3/1586; H02M 2001/0009; H02M 1/32
See application file for complete search history.

(56) References Cited

U.S. PATENT DOCUMENTS

| 4,401,856 | A * | 8/1983 | Curtin | H04Q 3/625 |
| | | | | 379/214.01 |
| 8,710,810 | B1 * | 4/2014 | McJimsey | H02M 3/1584 |
| | | | | 323/272 |
| 9,812,963 | B1 * | 11/2017 | Nguyen | H02M 3/1588 |

(Continued)

*Primary Examiner* — Daniel Kessie
*Assistant Examiner* — Sisay G Tiku
(74) *Attorney, Agent, or Firm* — Murphy, Bilak & Homiller, PLLC

(57) ABSTRACT

A multiphase voltage regulator includes a plurality of power stages, a plurality of current sense circuits, a controller and a current sense interface running between the controller and one or more of the current sense circuits. The current sense interface includes a separate line for each current sense circuit coupled to the current sense interface and which is configured to support single-ended or differential current sense. The regulator also includes a plurality of pullup circuits, each of which is connected to one of the current sense interface lines and has a higher impedance than the line to which it is connected. A fault detection circuit of the controller determines if an individual one of the current sense interface lines has an open fault, based on the pullup circuit connected to the line with the open fault pulling up the voltage on the line by more than a predetermined amount.

32 Claims, 7 Drawing Sheets

(56) References Cited

U.S. PATENT DOCUMENTS

| | | | |
|---|---|---|---|
| 2007/0200538 A1* | 8/2007 | Tang | H02M 3/157 323/237 |
| 2011/0221405 A1* | 9/2011 | Tang | H02M 3/156 323/234 |
| 2012/0286769 A1* | 11/2012 | Torti | H02M 3/1584 324/107 |
| 2013/0249518 A1* | 9/2013 | Giannopoulos | H02M 3/156 323/284 |
| 2015/0002112 A1* | 1/2015 | Tang | G01R 31/42 323/271 |
| 2015/0236586 A1 | 8/2015 | Babazadeh et al. | |
| 2015/0331049 A1* | 11/2015 | Luo | G06F 1/26 324/416 |
| 2015/0349634 A1* | 12/2015 | Tschirhart | G01R 19/32 323/271 |
| 2016/0049874 A1* | 2/2016 | Kobayashi | H02M 3/157 323/271 |
| 2016/0233766 A1* | 8/2016 | Todorov | H02M 3/1584 |
| 2017/0063239 A1* | 3/2017 | Wu | G06F 1/26 |
| 2017/0110963 A1* | 4/2017 | Mattingly | G01R 31/40 |
| 2017/0179828 A1 | 6/2017 | Tang et al. | |
| 2018/0234012 A1* | 8/2018 | You | H02M 3/1584 |

\* cited by examiner

FAULTY CURRENT SENSE LINE DETECTION IN MULTIPHASE VOLTAGE REGULATORS

BACKGROUND

There are many failure conditions in multiphase and parallel converter type voltage regulators where the voltage regulator may still provide regulation under some conditions, but will fail when the operating conditions change. In some cases, the failures may be catastrophic, if the failure condition is undetected and the voltage regulator is operated significantly beyond its operating limit, and may result in a significant exothermic event where component and system damage may be alarming, and possibly even cascade into a more serious event. In addition to output voltage sense circuits, voltage regulators make use of current sense circuits which enable the controller to monitor the current flowing through critical components in a regulator, such as power switches or the output inductor, for regulation, control, telemetry, and protection. In the case of an open current sense line, through faulty manufacturing or component failure, the open current sense line failure may be undetected by the controller, which will continue operating the voltage regulator as if no failure exists, but with faulty current sense information. By operating with faulty current sense information, the voltage regulator may operate significantly beyond the operating limits of the power components.

Thus, there is a need for a mechanism to detect open current sense lines in multiphase and parallel converter type voltage regulators.

SUMMARY

According to an embodiment of a multiphase voltage regulator, the multiphase voltage regulator comprises: a plurality of power stages, each of which is configured to deliver a phase current to a load; a plurality of current sense circuits, each of which is configured to provide a current sense signal representative of the phase current delivered to the load by the power stage coupled to the current sense circuit; a controller configured to control the plurality of power stages to regulate an output voltage provided to the load, based at least partly on the current sense signals provided by the current sense circuits; a current sense interface running between the controller and one or more of the current sense circuits, the current sense interface comprising a separate line for each current sense circuit coupled to the current sense interface and which is configured to support single-ended or differential current sense; and a plurality of pullup circuits, each of which is connected to one of the current sense interface lines and has a higher impedance than the line to which the pullup circuit is connected. The controller comprises a fault detection circuit configured to determine if an individual one of the current sense interface lines has an open fault, based on the pullup circuit connected to the line with the open fault pulling up the voltage on the line by more than a predetermined amount.

The current sense interface may comprise a separate single current sense line for each current sense circuit coupled to the current sense interface and which is configured to support single-ended current sense, and a pullup circuit may be connected to a corresponding one of the single current sense lines.

The current sense interface may comprise a separate current sense line and a separate current reference line for each current sense circuit coupled to the current sense interface and which is configured to support differential current sense, and a pullup circuit may be connected to a corresponding one of the current sense lines.

The current sense interface may comprise a separate current sense line and a separate current reference line for each current sense circuit coupled to the current sense interface and which is configured to support differential current sense, and a pullup circuit may be connected to a corresponding one of the current reference lines.

Separately or in combination, the current sense interface may comprise a separate current sense line and a separate current reference line for each current sense circuit coupled to the current sense interface and which is configured to support differential current sense, and a first pullup circuit may be connected to a corresponding one of the current sense lines a second pullup circuit may be connected to a corresponding one of the current reference lines.

Separately or in combination, at least one of the current sense circuits may be a DCR (direct current resistance) sensor comprising an RC network coupled in parallel with an inductor, wherein the voltage across the capacitor is proportional to the voltage drop across the parasitic DCR of the inductor and the inductor current. The current sense interface may be configured to support differential current sense, and may comprise a current sense line coupled to a first terminal of the capacitor of the RC network and a current reference line coupled to a second terminal of the capacitor. A pullup circuit may be connected to the current sense line, a pullup circuit may be connected to the current reference line, or a first pullup circuit may be connected to the current sense line and a second pullup circuit may be connected to the current reference line.

Separately or in combination, at least one of the current sense circuits may be a single-ended output current mirror sensor integrated with the corresponding power stage, the current sense interface may comprise a single current sense line configured to support single-ended current sense, and a pullup circuit may be connected to the single current sense line.

Separately or in combination, at least one of the current sense circuits may be a differential output current mirror sensor integrated with the corresponding power stage, and the current sense interface may be configured to support differential current sense and may comprise a current sense line connected to a first output node of the differential output current mirror sensor and a current reference line connected to a second output node of the differential output current mirror sensor. A pullup circuit may be connected to the current sense line, a pullup circuit may be connected to the current reference line, or a first pullup circuit may be connected to the current sense line and a second pullup circuit may be connected to the current reference line.

Separately or in combination, at least one of the pullup circuits may comprise a discrete pullup resistor located in close proximity to the controller.

Separately or in combination, at least one of the pullup circuits may be integrated with the controller.

Separately or in combination, at least one of the pullup circuits may comprise a pullup resistor, a transistor or a current source integrated with the controller.

Separately or in combination, a switch may be coupled to at least one of the pullup circuits and configured to disconnect the at least one of the pullup circuit from the current sense interface lines when the multiphase voltage regulator is regulating the output voltage provided to the load.

Separately or in combination, the controller may be configured to ignore voltage measurements taken from the current sense interface when one or more of the pullup circuits is enabled by switches and the multiphase voltage regulator is regulating the output voltage provided to the load.

Separately or in combination, the fault detection circuit may comprise a comparator circuit configured to compare voltage measurements taken over the current sense interface to a threshold detection voltage to determine if an individual one of the current sense interface lines has an open fault.

Separately or in combination, the controller may comprise an ADC (analog-to-digital converter) configured to convert analog voltage measurements over the current sense interface to corresponding digital values, and the fault detection circuit may be configured to determine if an individual one of the current sense interface lines has an open fault based on whether the digital values fall outside a predetermined range.

Separately or in combination, the fault detection circuit may be configured to determine if an individual one of the current sense interface lines has an open fault during a startup mode of the multiphase voltage regulator.

Separately or in combination, the multiphase voltage regulator may be configured to begin regulating the output voltage provided to the load after exiting a startup mode and after responding to a voltage regulator enable signal received by the multiphase voltage regulator, and the fault detection circuit may be configured to determine if an individual one of the current sense interface lines has an open fault after the multiphase voltage regulator exits the startup mode and before the multiphase voltage regulator responds to the voltage regulator enable signal.

Separately or in combination, in response to the fault detection circuit detecting that an individual one of the current sense interface lines has an open fault, the controller may be configured to at least one of: set a fault in a status register; emulate or zero the phase current of the power stage for which an open fault has been detected on the corresponding current sense interface line; disable the power stage for which an open fault has been detected on the corresponding current sense interface line, while continuing to regulate the output voltage provided to the load through the other power stages; and shut down the controller.

According to an embodiment of a method of operating a multiphase voltage regulator having a plurality of power stages each configured to deliver a phase current to a load, a plurality of current sense circuits each configured to provide a current sense signal representative of the phase current delivered to the load by the power stage coupled to the current sense circuit, and a current sense interface running between the controller and one or more of the current sense circuits, the current sense interface comprising a separate line for each current sense circuit coupled to the current sense interface and which is configured to support single-ended or differential current sense, the method comprises: connecting separate pullup circuits to individual ones of the current sense interface lines, the pullup circuit having a higher impedance than the current sense interface line to which the pullup circuit is connected; and determining if an individual one of the current sense interface lines has an open fault, based on the pullup circuit connected to the line with the open fault pulling up the voltage on the line by more than a predetermined amount.

The method may further comprise disabling at least one of the pullup circuits when the multiphase voltage regulator is regulating an output voltage provided to the load.

Separately or in combination, the method may further comprise ignoring voltage measurements taken over the current sense interface when at least one of the pullup circuits is enabled and the multiphase voltage regulator is regulating an output voltage provided to the load.

Separately or in combination, determining if an individual one of the current sense interface lines has an open fault may comprise comparing voltage measurements taken over the current sense interface to a threshold detection voltage.

Separately or in combination, the method may further comprise converting analog voltage measurements taken over the current sense interface to corresponding digital values, wherein an individual one of the current sense interface lines may be determined to have an open fault based on whether the digital values fall outside a predetermined range.

Separately or in combination, determining if an individual one of the current sense interface lines has an open fault may comprise determining if an individual one of the current sense interface lines has an open fault during a startup mode of the multiphase voltage regulator.

Separately or in combination, the method may further comprise beginning regulation of an output voltage provided to the load after exiting a startup mode and after responding to a voltage regulator enable signal received by the multiphase voltage regulator, wherein determining if an individual one of the current sense interface lines has an open fault may comprise determining if an individual one of the current sense interface lines has an open fault after the multiphase voltage regulator exits the startup mode and before the multiphase voltage regulator responds to the voltage regulator enable signal.

Separately or in combination, the method may further comprises in response determining that an individual one of the current sense interface lines has an open fault, at least one of: setting a fault in a status register; emulating or zeroing the phase current of the power stage for which an open fault has been detected on the corresponding current sense interface line; disabling the power stage for which an open fault has been detected on the corresponding current sense interface line, while continuing to regulate the output voltage provided to the load through the other power stages; and shutting down the controller.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

The embodiments described herein provide a mechanism for detecting an open current sense line (in the case of either single-ended or differential current sense) and/or an open current reference line (in the case of differential current sense) in a multiphase voltage regulator. An open current sense or reference line may be detected during power-up of the multiphase voltage regulator, during regulation of the output voltage provided to the load, or after power-up and before the voltage regulator begins regulating the output voltage. The open line detection mechanism described herein enables the controller to identify which phase of the voltage regulator has an open current sense and/or reference line. The controller may respond to the detected open line fault by, e.g., setting a fault in a status register, emulating or zeroing the phase current of the power stage for which an open fault has been detected, disabling the power stage for which an open fault has been detected while continuing to regulate the output voltage provided to the load through the other power stages, shutting down the controller, etc.

The term "line" as used herein describes a specific physical connection made between the current sense circuitry of a regulator power stage and the corresponding controller input pin. The lines described herein may comprise a single PCB (printed circuit board) trace, a plurality of traces across multiple PCBs and connectors carrying the same electric signal, etc. Such physical connections may also be described as signals, connections, wires, traces, interfaces, nodes, etc. In each case, an open current sense or reference 'line' means that the associated connection between the current sense circuitry and the corresponding controller input pin is not being made electrically.

Figure 1:
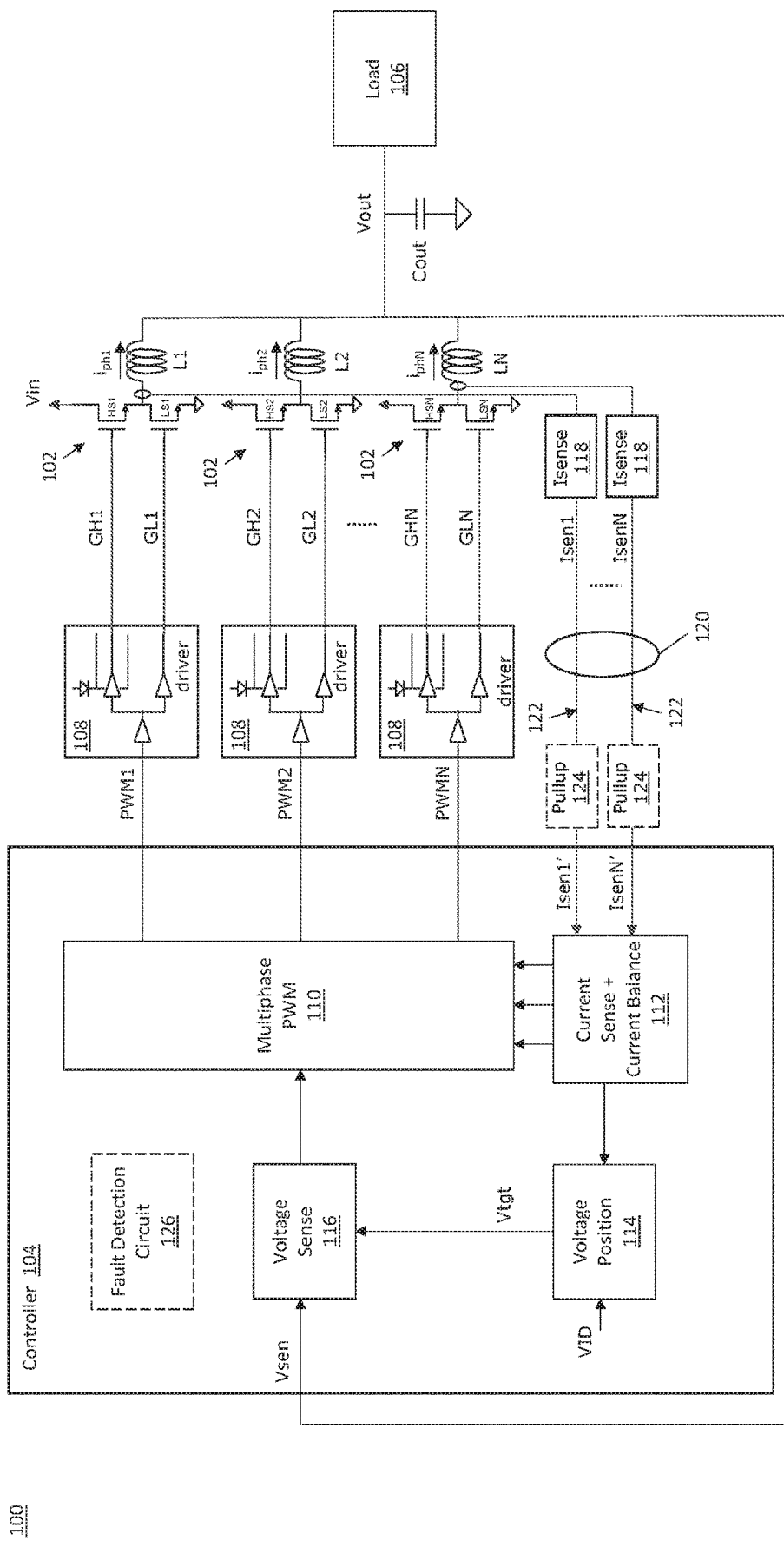
FIG. 1 illustrates a block diagram of an embodiment of a multiphase voltage regulator with open current sense interface line fault detection.

FIG. 1 illustrates an embodiment of a multiphase voltage regulator (VR) 100. The multiphase VR 100 includes a plurality of power stages 102 and a controller 104 for controlling operation of the individual power stages 102, so as to regulate the output voltage (Vout) provided to a load 106. The power stages 102 may be connected to the load 106 via a respective inductor Lx and via an output capacitor Cout, which can be physically implemented as a single capacitor or a bank of capacitors. The load 106 can be an electronic system requiring one or more regulated voltages, such as a processor, ASIC (application-specific integrated circuit), memory device, etc., or the load 106 can be another voltage regulator e.g. in the case of a multi-stage VR.

The power stages 102 of the multiphase VR 100 include respective high-side and low-side switch devices HSx, LSx connected between an input voltage (Vin) and a reference potential such as ground. The high-side and low-side switch devices HSx, LSx are coupled at a common node to the corresponding output inductor Lx, and the power stages 102 also include drive circuitry 108 configured to drive the respective gates of the high-side and low-side switch devices HSx, LSx of that power stage 102. The power stages 102 are configured to output a phase current $i_{phx}$ to the load 106 through the corresponding inductor Lx in response to a control signal such as a PWM signal (PWMx) input to the power stage 102.

The controller 104 generates the control signals input to the power stages 102, and sets the switching frequency of the control signals. For example, the controller 104 may include PWM (pulse width modulation) circuitry 110 for generating the PWM control signals provided to the respective power stages 102.

The controller 104 may also include current sense and balance circuitry 112 for sensing the individual phase currents $i_{phx}$ of the power stages 102, and converting the sensed current information into phase current information. The current sense and balance circuitry 112 converts the phase current information into adjustments to the duty cycle of each individual power stage 102, for adjusting the phase currents delivered to the load 106 so that the phase currents remain balanced.

The controller 104 may include a voltage position unit 114 for controlling changes from one VID to another by ramping a target voltage, where 'VID' is voltage identification information provided to the multiphase VR 100 for implementing power supply voltage changes. The voltage position unit 114 may include an adaptive voltage positioning (AVP) circuit for converting the phase current information from the current sense and balance circuitry 112 into an offset from a set-point, to set the regulator target voltage based on load current. The voltage position unit 114 may also include a VID interface for converting the VID information to a target voltage, and logic for setting the target voltage (Vtgt) of the multiphase VR 100 based on the target voltage information provided by the VID interface and the offset information provided by the AVP circuit.

The controller 104 may include a voltage sense unit 116 for sensing the output voltage feedback Vsen input to the controller 104, and a voltage error circuit for determining the error between the output voltage feedback Vsen and the target voltage Vtgt provided by the voltage position unit 114. The controller 104 may implement a PID (proportional-integral-derivative) or similar control circuit with standard feedforward control for converting the error voltage, the target voltage Vtgt and the sensed voltage feedback Vsen into a digital representation provided to the multiphase PWM 110.

The multiphase VR 100 also includes current sense (Isense) circuits 118. The current sense circuits 118 are coupled to a respective power stage 102 and provide a current sense signal (Isenx) representative of the phase current $i_{phx}$ delivered to the load 106 by the power stage 102 coupled to that current sense circuit 118. The controller 104 is configured to control the power stages 102 to regulate the output voltage Vout provided to the load 106 based at least partly on the current sense signals Isenx provided by the current sense circuits 118. For instance, the controller 104 may be configured to control a given power stage 102 based at least on the current sense signal Isenx provided by the corresponding current sense circuit 118, but not the current sense signals provided by current sense circuits 118 associated to other power stages 102. In one embodiment, the controller 104 is configured to control a given power stage 102 based at least on the current sense signal Isenx provided by the corresponding current sense circuit 118, as well as one or more current sense signals provided by a current sense circuit 118 associated with other power stage(s) 102.

A current sense interface 120 running between the controller 104 and at least one of the current sense circuits 118 carries the corresponding current sense signals Isenx to the controller 104. The current sense interface 120 includes one or more separate lines 122 for each current sense circuit 118 coupled to current sense interface 120. For example, in the case of single-ended current sense, the current sense interface 120 has a single current sense line coupled to the corresponding current sense circuit 118 and configured to support single-ended current sense. In the case of differential current sense, the current sense interface 120 has a current sense line and a current reference line coupled to the corresponding current sense circuit 118 and configured to support differential current sense. One line 122 is shown coupled to the respective current sense circuits 118 in FIG. 1 for ease of illustration only. The illustrated line 122 may represent a single line or a pair of lines as described above, depending on whether the controller 104 supports single-ended or differential current sense.

In each case, if an individual one of the current sense interface lines 122 has an open fault, e.g., due to faulty manufacturing or component failure, the corresponding current sense input Isenx' of the controller 104 will not have accurate phase current information. Faulty phase current information at the controller 104 may lead to a host of problems.

To mitigate open line faults on the current sense interface 120, the multiphase VR 100 includes a separate pullup circuit 124 connected to one or more of the lines 122 of the current sense interface 120. Advantageously, the multiphase VR 100 includes a pullup circuit 124 for each line 122, as illustrated in FIG. 1. The pullup circuits 124 have a higher impedance than the respective lines 122 to which the pullup circuits 124 are connected. For example, the pullup circuits 124 may have an impedance of at least 100 kΩ, at least 150 kΩ, or higher. The current sense interface lines 122 have relatively low impedance, e.g., several hundred Ω or less. This way, a pullup circuit 124 connected to a current sense interface line 122 without an open fault introduces little measurement error onto the current sense interface line 122 since the line 122 presents a significantly lower impedance path to the controller 104 as compared to the pullup circuit 124 and therefore will keep the voltage on that line 122 from rising substantially. In the event of an open current sense interface line 122, the pullup circuit 124 connected to the open line 122 will pull up the voltage on the line 122 by a substantial amount, causing a noticeably high current to appear at the corresponding current sense input Isenx' of the controller 104.

The controller 104 includes a fault detection circuit 126 for determining if an individual one of the current sense interface lines 122 has an open fault, based on the pullup circuit 124 connected to the line 122 with an open fault pulling up the voltage on the line 122 by more than a predetermined amount. The fault detection circuit 126 may receive as inputs the current sense information directly from the corresponding controller inputs Isenx', or may receive processed phase current information from the current sense and balance circuitry 112. The fault detection circuit 126 is illustrated with a dashed box to indicate that the inputs to the fault detection circuit 126 may come directly from the corresponding controller inputs Isenx' or from the current sense and balance circuitry 112.

The controller 104 may perform open fault detection independently on all phases. Absent an open fault on a current sense interface line 122, the line impedance is low enough so that the current sense interface line 122 drives the signal to a correct voltage level and the pullup circuit 124 connected to the line 122 has little to no effect on the voltage level. If, however, a current sense interface line 122 has an open fault, the pullup circuit 124 connected to the line 122 pulls up the voltage on the line 122 by an amount detected by the fault detection circuit 126. The pullup circuits 124 are illustrated with dashed boxes in FIG. 1 to indicate that the pullup circuits 124 may be external or internal to the controller 104.

Figure 2:
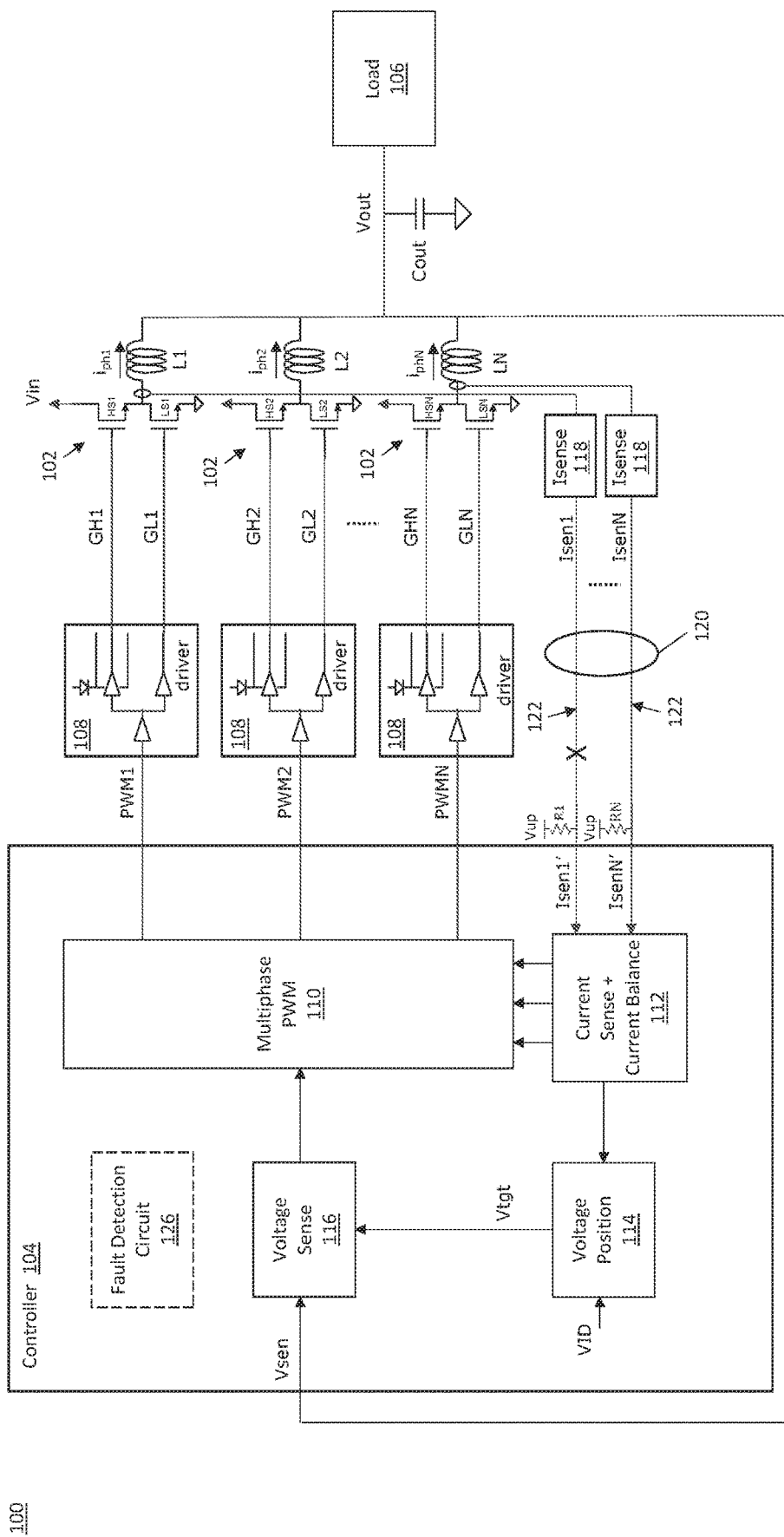
FIG. 2 illustrates a block diagram of an embodiment of a pullup circuit used in detecting an open current sense interface line.

FIG. 2 illustrates one embodiment of the pullup circuits 124. According to this embodiment, each pullup circuit 124 comprises a discrete pullup resistor Rx located in close proximity to the controller 104. That is, the discrete resistors Rx are physically positioned close to the controller 104 so as to be effective at detecting open faults along most of the length of the current sense interface lines 122. The pullup circuits 124 may instead be integrated with the controller 104. For example, each pullup circuit 124 may be a pullup resistor, a transistor or a current source integrated with the controller 104.

FIG. 2 also illustrates a scenario in which the current sense interface line 122 for the first power stage 102 has an open fault as indicated by the label 'X' in FIG. 2. The other current sense interface lines 122 do not have open faults in this example scenario. The pullup circuits 124 connected to a current sense interface line 122 without an open fault introduce little measurement error onto the corresponding current sense interface lines 122, as explained above. However, the pullup circuit 124 connected to the first current sense interface line 122 which has an open fault pulls up the voltage on the line to Vup−R1*iR1 where Vup is the supply voltage applied to the pullup circuit 124 and iR1 is the current flowing through discrete resistor R1. The pullup supply voltage Vup may be the input voltage Vin to the multiphase VR 100 or a different supply voltage. The pulled-up voltage on the current sense interface line 122 with the open fault causes a noticeably high current to appear at the corresponding current sense input Isen1' of the controller 104, which is detected by the fault detection circuit 126 included in the controller 104. In general, one or more of the current sense interface lines 122 running between the controller 104 and the current sense circuits 118 may have an open fault which can be detected by the fault detection circuit 126 in conjunction with the corresponding pullup circuit(s) 124.

Figure 3:
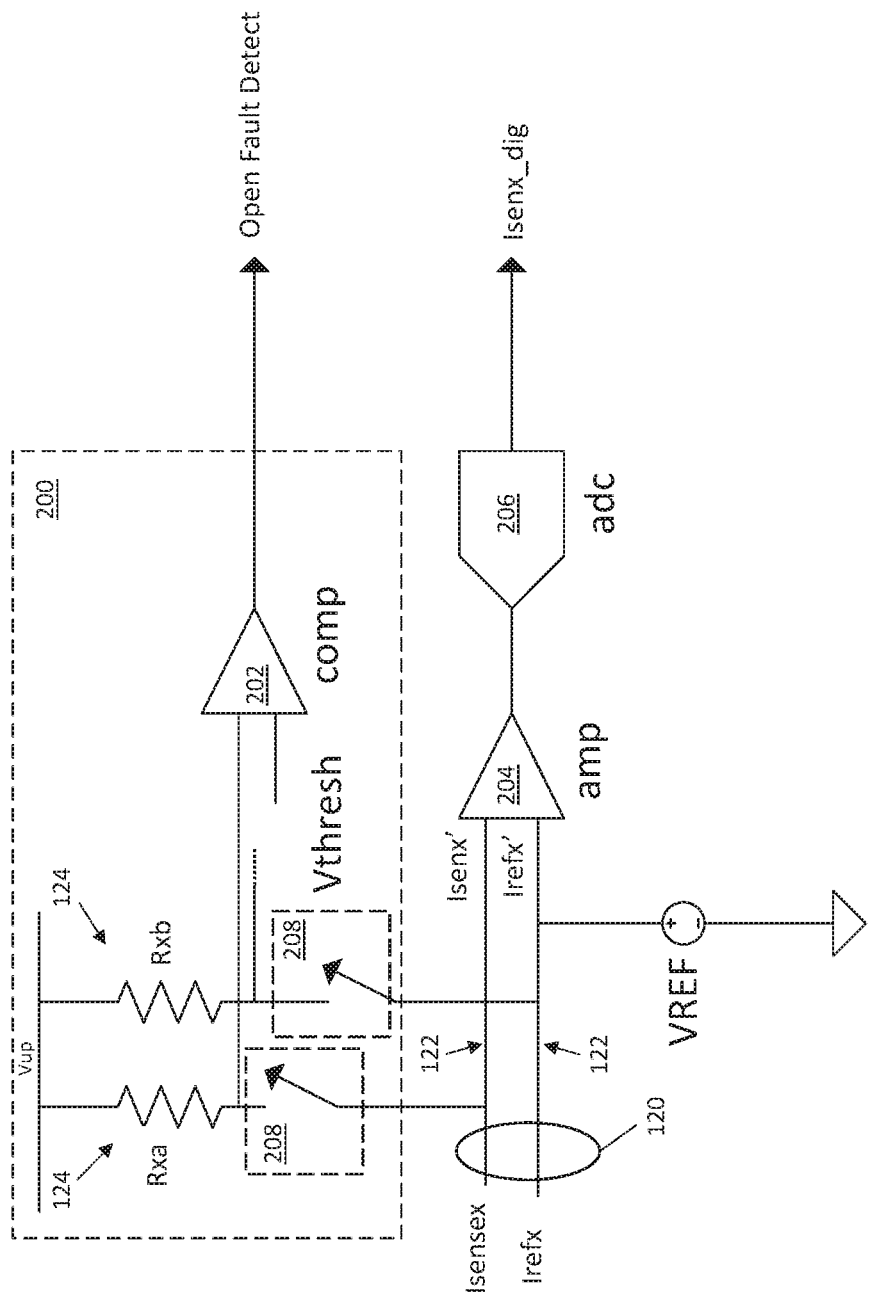
FIG. 3 illustrates a block diagram of an embodiment of a differential open current sense interface line fault detection circuit.

FIG. 3 illustrates an embodiment of the fault detection circuit 126 included in the VR controller 104. According to this embodiment, the fault detection circuit 126 comprises a comparator circuit 200 associated with the corresponding pullup circuit 124. The comparator circuit 200 is configured to compare voltage measurements taken over the current sense interface 120 to a threshold detection voltage (Vthresh) to determine if an individual one of the current sense interface lines 122 has an open fault. For differential current sense, a current sense line Isensex and a current reference line Irefx is provided. A comparator (comp) 202 is coupled to the corresponding line 122. A pullup circuit 124 may be provided for one or both lines 122 in the case of differential current sense. For example, a single pullup circuit 124 may be connected to either the current sense line Isenx or the current reference line Irefx. In this embodiment, an open fault can be detected on the line 122 with the pullup circuit 124 but not on the other line 122. In another embodiment, pullup circuits 124 may be provided for both lines 122 in the case of differential current sense. For example, a first pullup circuit 124 may be connected to the current sense line Isenx and a second pullup circuit 124 may be connected to the associated current reference line Irefx.

The pullup circuit 124 illustrated in FIG. 3 is shown implemented as a pair of pullup resistors Rxa, Rxb configured for differential current sense. Transistors, current sources, or other active circuitry may be used in place of the pullup resistors Rxa, Rxb, wherein the pullup functionality is to provide a weak bias such that in the presence of a low impedance during nominal operation, the voltage on the sense line will not substantially deviate due to the presence of the pullup, but in the presence of a high impedance due to an open sense fault, the voltage on the sense line will rise significantly from its nominal value, and the open sense voltage can be detected due to this rise. The pullup resistors Rxa, Rxb are coupled to one input of the corresponding comparator 202. The other comparator input is coupled to the threshold detection voltage Vthresh. If either current sense interface line Isenx or Irefx has an open fault, the corresponding pullup circuit Rxa, Rxb will pullup the corresponding comparator input to a voltage level that exceeds the threshold detection voltage Vthresh, causing that comparator 202 to output an open fault detection signal ('Open Fault Detect').

The corresponding current sense inputs Isenx', Irefx' of the controller 104 are amplified by an amplifier (amp) 204 and converted to digital signals Isenx_dig by an ADC (analog-to-digital converter) 206 for processing by the current sense and balance circuitry 112 included in the VR controller 104, as previously explained herein. The amplifier 204 and ADC 206 shown in FIG. 3 may be part of the current sense and balance circuitry 1121, or may be implemented separate from the current sense and balance circuitry 112 by the controller 104.

Instead of implementing the fault detection circuit 126 using direct comparison implemented by the comparator circuit 200, the fault detection circuit 126 may instead utilize the ADC output Isenx_dig. According to this embodiment, the fault detection circuit 126 may determine if an individual one of the current sense interface lines 122 has an open fault based on whether the digital values associated with that line 122 fall outside a predetermined range. Absent a open fault on the current sense interface line 122, the voltage measurements taken from these lines should fall within the predetermined range. Detecting digital values that fall outside the predetermined range is an indication of an open fault on the corresponding current sense interface line 122.

Regardless of the type of fault detection implementation (comparator-based, ADC-based, etc.), the controller 104 may include, for one or more of the pullup circuits 124, a switch 208 coupled between the corresponding pullup circuit 124 and the current sense interface line 122 to which that pullup circuit 124 is coupled. The controller 104 may open the switches 208 to disconnect the pullup circuits 124 from the current sense interface lines 122 when the multiphase VR 100 is regulating the output voltage Vout provided to the load 106, to avoid current signal errors introduced by the pullup circuits 124. The controller 104 may to ignore voltage measurements taken from the current sense interface lines 122 when the pullup circuits 124 are enabled by the switches 208 and the multiphase VR 100 is regulating the output voltage Vout provided to the load 106. In this scenario, the controller 104 is looking for current sense interface lines 122 with open faults while in regulation mode, and therefore the voltage measurements taken from these lines may have some minor error introduced by the pullup circuits 124 and may be ignored. Depending on the magnitude of the error introduced by the pullup circuits 124, the controller 104 may instead use the voltage measurements with or without compensation or correction while the pullup circuits 124 are coupled to the current sense interface lines 122.

Figure 4:
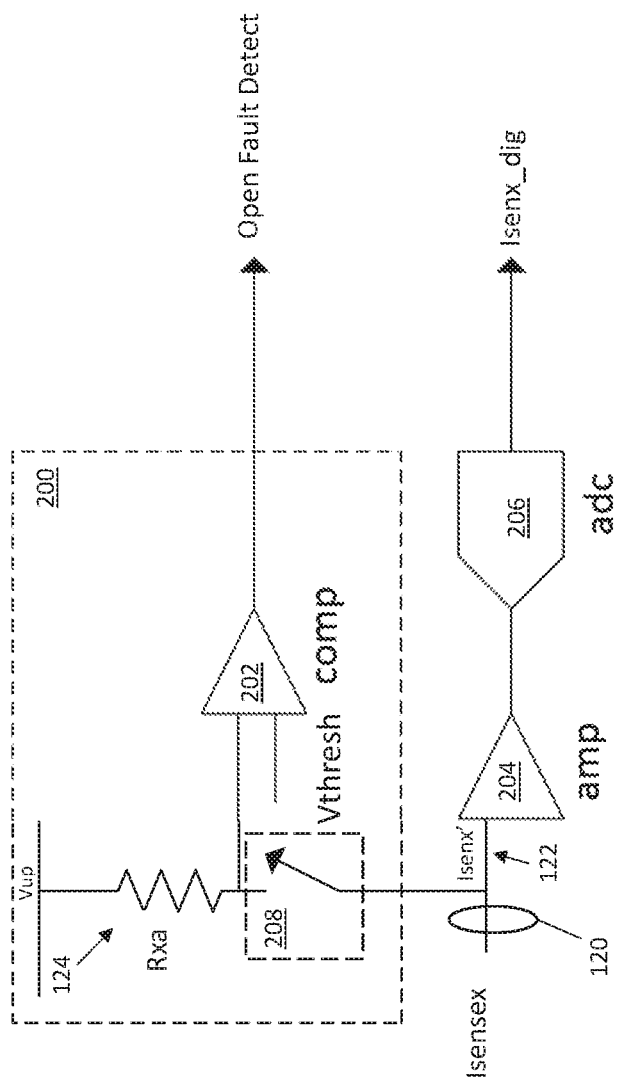
FIG. 4 illustrates a block diagram of an embodiment of a single-ended open current sense interface line fault detection circuit.

FIG. 4 illustrates another embodiment of the fault detection circuit 126 included in the controller 104. The embodiment shown in FIG. 4 is similar to the embodiment shown in FIG. 3. Different, however, the controller 104 is configured for single-ended current sense. According to this embodiment, a single current sense line Isensex is connected to the corresponding pullup circuit 124. The corresponding pullup circuit 124 is shown implemented as a pullup resistor Rx in FIG. 4. However, a transistor or current source may be used in place of the pullup resistor Rx. In each case, the single-ended pullup circuit 124 is coupled to one input of a comparator 202. The other comparator input is coupled to the threshold detection voltage Vthresh. If the single-ended current sense line Isenx has an open fault, the pullup circuit 124 will pullup the comparator input to a voltage level that exceeds the threshold detection voltage Vthresh, causing that comparator 202 to output an open fault detection signal ('Open Fault Detect'). As with the embodiment shown in FIG. 3, the single-ended pullup circuit 124 may be disconnected from the corresponding single-ended current sense line Isensex by a switch 208 which is controlled by the controller 104.

Described next are embodiments of the current sense circuits 118 used to sense the current output by the power stages 102 of the multiphase VR 100. As described previously herein, the current sense circuits 118 provide a current sense signal (Isenx) representative of the phase current $i_{phX}$ delivered to the load 106 by the power stage 102 coupled to that current sense circuit 118, either in a differential or single-ended manner. Any standard current sense circuit may be used.

Figure 5:
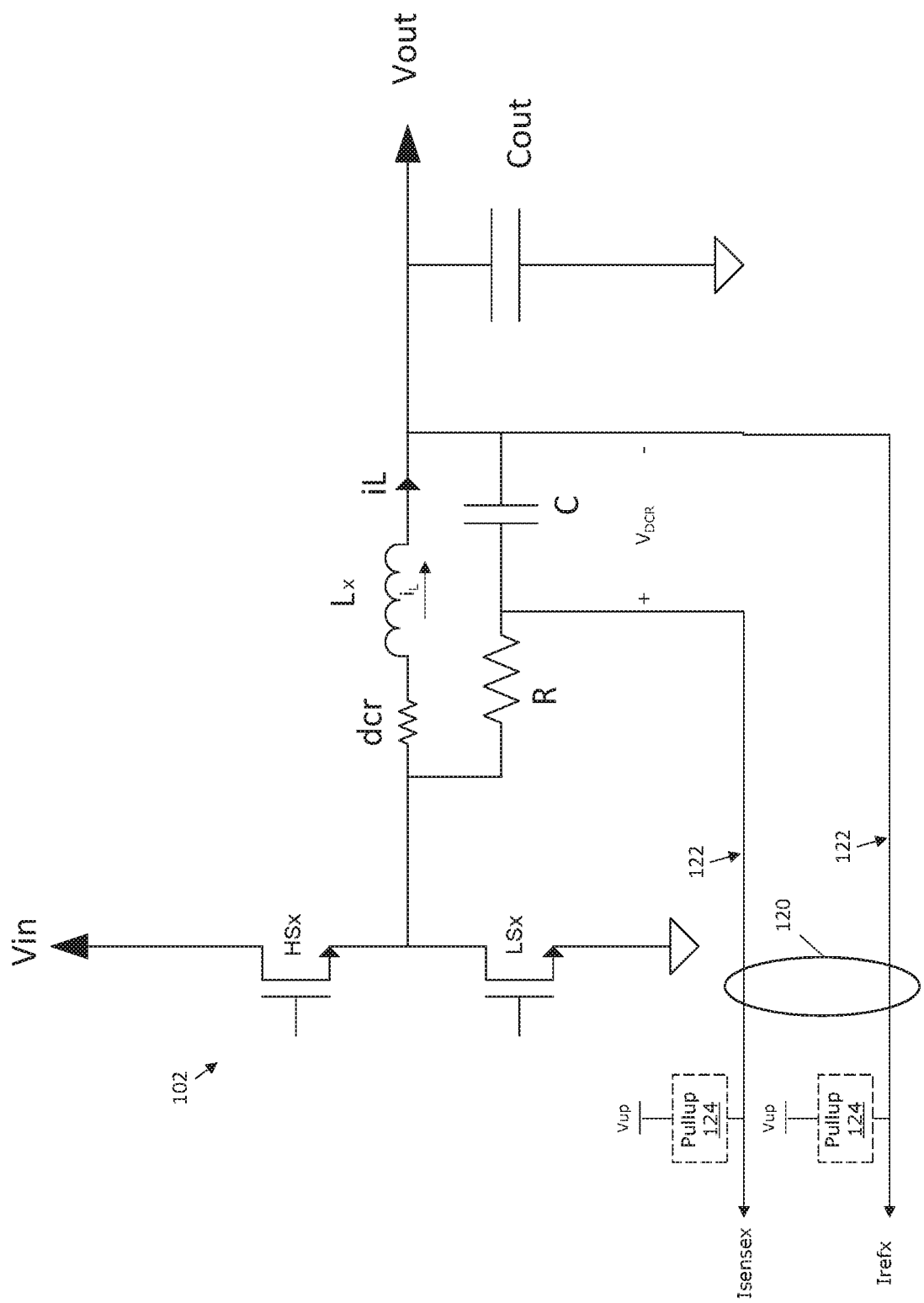
FIG. 5 illustrates a block diagram of an embodiment a DCR-based current sense circuit used as part of the open current sense interface line fault detection mechanism.

FIG. 5 illustrates an embodiment in which at least one of the current sense circuits 118 is implemented as a DCR (direct current resistance) sensor. The DCR sensor includes an RC network coupled in parallel with the output inductor Lx connected to the corresponding power stage 102. The DCR sensor makes use of the inherent resistance (dcr) of the output inductor Lx (or, similarly, a winding of a transformer), together with the RC network. The capacitor C and sense resistor R of the RC network are chosen such that a voltage output $V_{DCR}$ from the DCR sensor may be used to estimate the current $i_L$ through the output inductor Lx (or transformer winding). That is, the RC time constant may be matched to L/dcr. The differential voltage $V_{DCR}$ is proportional to iL*dcr.

For such a DCR-based current sense circuit, the current sense interface 120 may be configured to support differential current sense. In this case, a current sense line Isensex may be coupled to a first terminal of the capacitor C of the RC network and a current reference line Irefx may be coupled to a second terminal of the capacitor C. A pullup circuit 124 may be provided for one or both lines 122. For example, a single pullup circuit 124 may be connected to either the current sense line Isensex or the current reference line Irefx. In this embodiment, an open fault can be detected on the line 122 with the pullup circuit 124 but not on the other line 122. In another embodiment, pullup circuits 124 may be provided for both lines 122. For example, a first pullup circuit 124 may be connected to the current sense line Isensex and a second pullup circuit 124 may be connected to the associated current reference line Irefx. In each case, the Irefx voltage is equal to Vout and the Isenx voltage is equal to Vout+iL*dcr.

Figure 6:
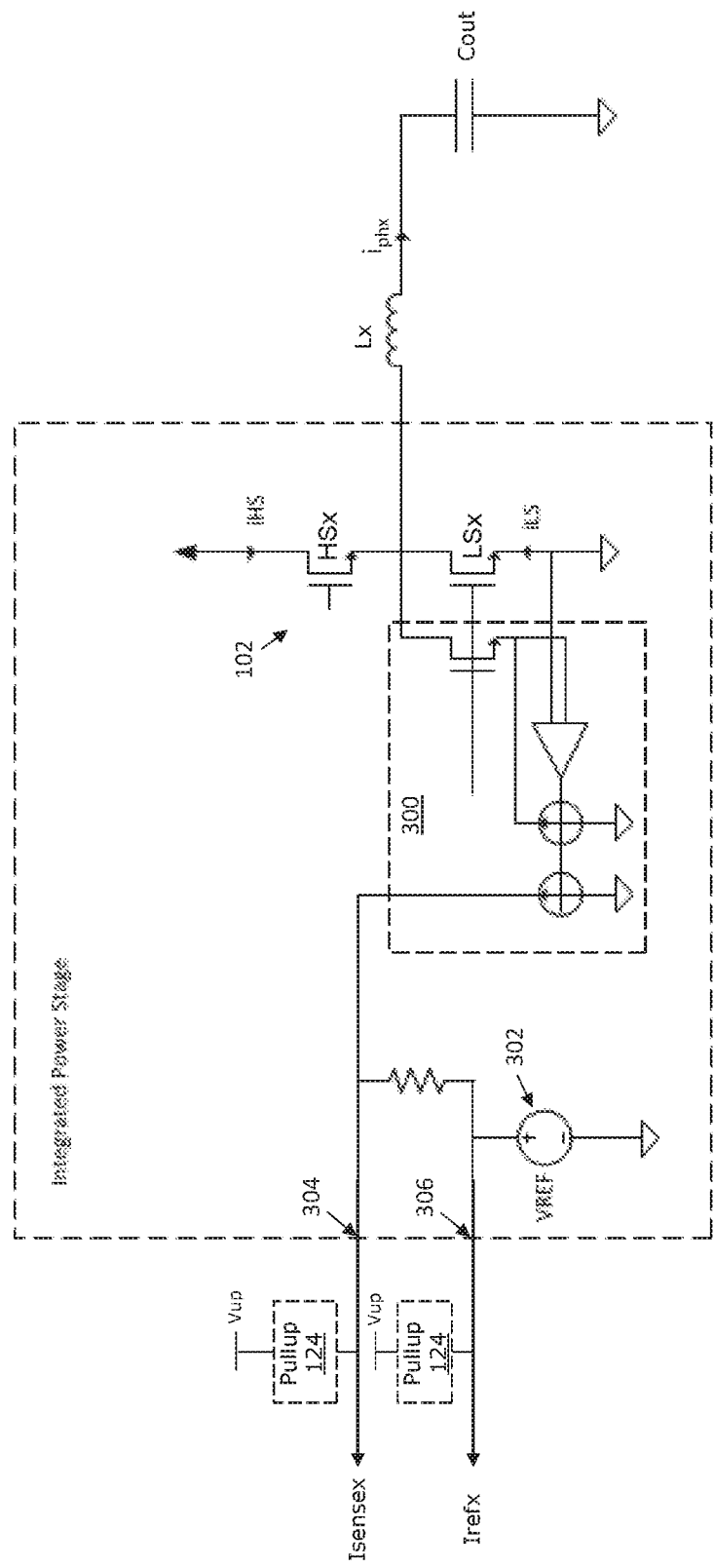
FIG. 6 illustrates a block diagram of an embodiment an integrated differential current mirror-based sensor used as part of the open current sense interface line fault detection mechanism.

FIG. 6 illustrates an embodiment in which at least one of the current sense circuits 118 is implemented as a differential output current mirror sensor integrated with the corresponding power stage 102. The differential output current mirror sensor includes a mirror circuit 300 which mirrors either the high-side current iHS or the low-side current iLS of the power stage 102, to reconstruct the corresponding phase current $i_{phX}$ onto the current sense line Isensex coupled to that power stage 102. The differential output current mirror sensor also includes a voltage reference source 302 for generating a reference voltage Vref which drives the associated current reference line Irefx. The reference voltage Vref may be generated internally by the integrated power stage 102 or externally provided, and is proportional to the corresponding phase current $i_{phX}$. The output of the differential output current mirror sensor may be a current or voltage from the mirror circuit 300.

For such a differential current mirror-based current sense circuit, the current sense interface 120 may be configured to support differential current sense and include a current sense line Isensex connected to the first output node 304 of the differential output current mirror sensor and a current reference line Irefx connected to the second output node 306 of the differential output current mirror sensor. A pullup circuit 124 may be provided for one or both lines 122. For example, a single pullup circuit 124 may be connected to either the current sense line Isensex or the current reference line Irefx. In this embodiment, an open fault can be detected on the line 122 with the pullup circuit 124 but not on the other line 122. In another embodiment, pullup circuits 124 may be provided for both lines 122. For example, a first pullup circuit 124 may be connected to the current sense line Isensex and a second pullup circuit 124 may be connected to the associated current reference line Irefx.

Figure 7:
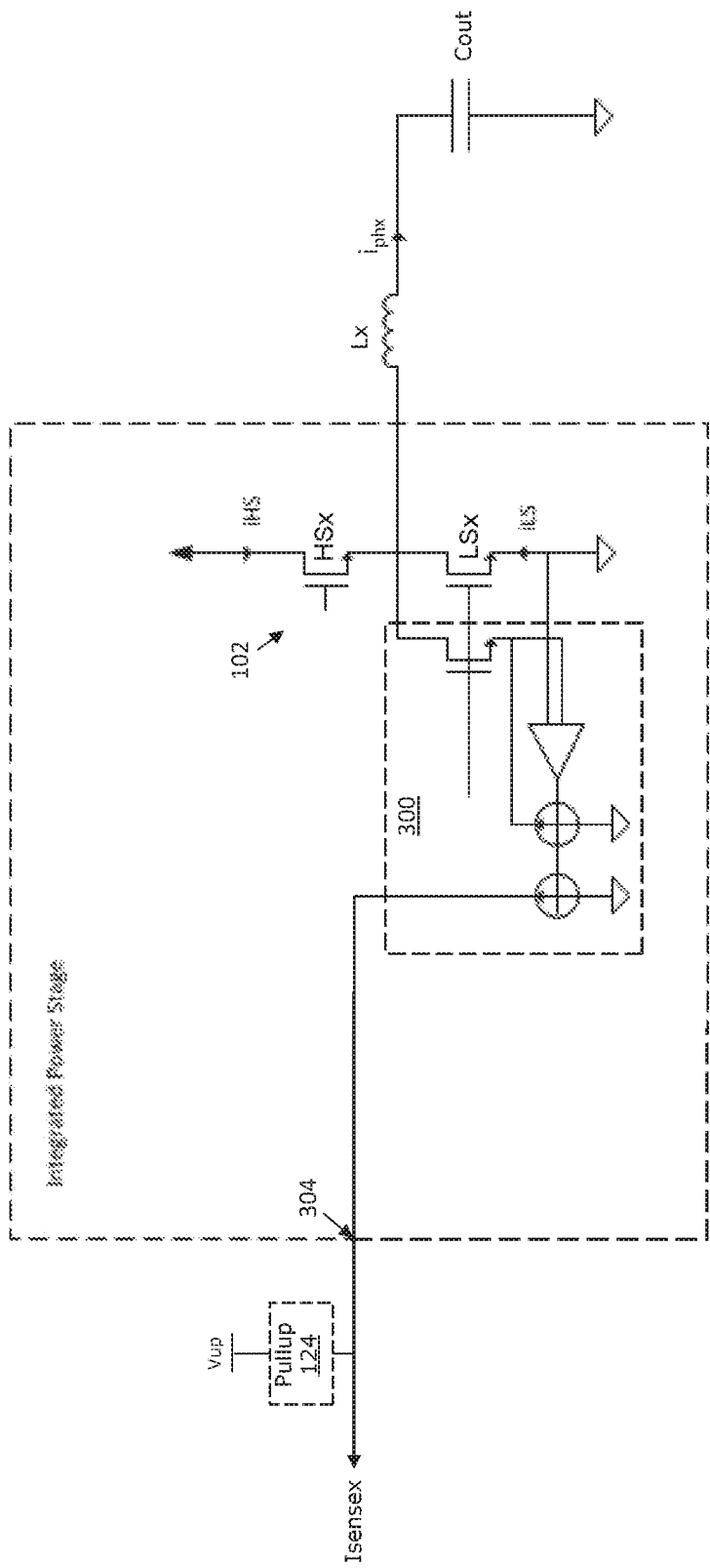
FIG. 7 illustrates a block diagram of an embodiment an integrated single-ended current mirror-based sensor used as part of the open current sense interface line fault detection mechanism.

FIG. 7 illustrates another embodiment of the current sense circuits 118. The embodiment shown in FIG. 7 is similar to the embodiment shown in FIG. 6. Different, however, the current sense circuit 118 is implemented as a single-ended output current mirror sensor integrated with the corresponding power stage 102. According to this embodiment, a single current sense line Isensex configured to support single-ended current sense is provided for the corresponding power stage 102 and a pullup circuit 124 is connected to the single current sense line Isensex.

Described next are embodiments of when the VR controller 104 may implement the open fault detection mechanism previously described herein. The controller 104 may configure the fault detection circuit 126 to determine if an individual one of the current sense interface lines 122 has an open fault during a startup mode of the multiphase VR 100. The phase currents $i_{phX}$ are expected to be negligible during the startup mode. Hence, an open fault on any of the individual current sense interface lines 122 is readily detectable by the corresponding pullup circuit 124 injecting a non-negligible current on that line 122 and that non-negligible current being detected by the fault detection circuit 126 included in the VR controller 104.

After exiting the startup mode, a VR enable signal is sent to the multiphase VR 100 to indicate that the VR may begin regulating the output voltage Vout provided to the load 106. Before responding to the VR enable signal, the controller 104 may configure the fault detection circuit 126 to determine if individual ones of the current sense interface lines 122 have an open fault. This may be in addition or alternatively to configuring the fault detection circuit 126 to determine if individual ones of the current sense interface lines 122 have an open fault during the startup mode.

After responding to the VR enable signal and after beginning to regulate the output voltage Vout provided to the load 106, the controller 104 may configure the fault detection circuit 126 to determine if individual ones of the current sense interface lines 122 have an open fault. This may be in addition or alternatively to configuring the fault detection circuit 126 to determine if individual ones of the current sense interface lines 122 have an open fault during the startup mode and/or after exiting the startup mode and before responding to the VR enable signal. The controller 104 may disconnect the pullup circuits 124 from the current sense interface lines 122 when the multiphase VR 100 is regulating the output voltage Vout provided to the load 106, e.g., by opening switches 208 connected between the pullup circuits 124 and the current sense interface 120 as previously described herein.

In response to the fault detection circuit 126 detecting that an individual one of the current sense interface lines 122 has an open fault, the VR controller 104 may take one or more actions. For example, the controller 104 may take one or more of the following actions: set a fault in a status register of the controller 104 to indicate one of the phases has an open fault; emulate or zero the phase current $i_{phX}$ of the power stage 102 for which an open fault has been detected on the corresponding current sense interface line 122; disable the power stage 102 for which an open fault has been detected on the corresponding current sense interface line 122, while continuing to regulate the output voltage Vout provided to the load 106 through the other power stages 102; and shut down the controller 104.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A multiphase voltage regulator, comprising:
a plurality of power stages, each of which is configured to deliver a phase current to a load;
a plurality of current sense circuits, each of which is configured to provide a current sense signal representative of the phase current delivered to the load by the power stage coupled to the current sense circuit;
a controller configured to control the plurality of power stages to regulate an output voltage provided to the load, based at least partly on the current sense signals provided by the current sense circuits;

a current sense interface running between the controller and one or more of the current sense circuits, the current sense interface comprising a separate line for each current sense circuit coupled to the current sense interface and which is configured to support single-ended or differential current sense; and a plurality of pullup circuits, each of which is connected to one of the current sense interface lines and has a higher impedance than the line to which the pullup circuit is connected, wherein the controller comprises a fault detection circuit configured to determine if an individual one of the current sense interface lines has an open fault, based on the pullup circuit connected to the line with the open fault pulling up the voltage on the line by more than a predetermined amount.

2. The multiphase voltage regulator of claim 1, wherein the current sense interface comprises a separate single current sense line for each current sense circuit coupled to the current sense interface and which is configured to support single-ended current sense, and wherein a pullup circuit is connected to a corresponding one of the single current sense lines.

3. The multiphase voltage regulator of claim 1, wherein the current sense interface comprises a separate current sense line and a separate current reference line for each current sense circuit coupled to the current sense interface and which is configured to support differential current sense, and wherein a pullup circuit is connected to a corresponding one of the current sense lines.

4. The multiphase voltage regulator of claim 1, wherein the current sense interface comprises a separate current sense line and a separate current reference line for each current sense circuit coupled to the current sense interface and which is configured to support differential current sense, and wherein a pullup circuit is connected to a corresponding one of the current reference lines.

5. The multiphase voltage regulator of claim 1, wherein the current sense interface comprises a separate current sense line and a separate current reference line for each current sense circuit coupled to the current sense interface and which is configured to support differential current sense, and wherein a first pullup circuit is connected to a corresponding one of the current sense lines and a second pullup circuit is connected to a corresponding one of the current reference lines.

6. The multiphase voltage regulator of claim 1, wherein at least one of the current sense circuits is a DCR (direct current resistance) sensor comprising an RC network coupled in parallel with an inductor, and wherein the current sense interface is configured to support differential current sense and comprises a current sense line coupled to a first terminal of the capacitor of the RC network and a current reference line coupled to a second terminal of the capacitor.

7. The multiphase voltage regulator of claim 6, wherein a pullup circuit is connected to the current sense line.

8. The multiphase voltage regulator of claim 6, wherein a pullup circuit is connected to the current reference line.

9. The multiphase voltage regulator of claim 6, wherein a first pullup circuit is connected to the current sense line and a second pullup circuit is connected to the current reference line.

10. The multiphase voltage regulator of claim 1, wherein at least one of the current sense circuits is a single-ended output current mirror sensor integrated with a corresponding power stage, wherein the current sense interface comprises a single current sense line configured to support single-ended current sense, and wherein a pullup circuit is connected to the single current sense line.

11. The multiphase voltage regulator of claim 1, wherein at least one of the current sense circuits is a differential output current mirror sensor integrated with a corresponding power stage, and wherein the current sense interface is configured to support differential current sense and comprises a current sense line connected to a first output node of the differential output current mirror sensor and a current reference line connected to a second output node of the differential output current mirror sensor.

12. The multiphase voltage regulator of claim 11, wherein a pullup circuit is connected to the current sense line.

13. The multiphase voltage regulator of claim 11, wherein a pullup circuit is connected to the current reference line.

14. The multiphase voltage regulator of claim 11, wherein a first pullup circuit is connected to the current sense line and a second pullup circuit is connected to the current reference line.

15. The multiphase voltage regulator of claim 1, wherein at least one of the pullup circuits comprises a discrete pullup resistor located in close proximity to the controller.

16. The multiphase voltage regulator of claim 1, wherein at least one of the pullup circuits is integrated with the controller.

17. The multiphase voltage regulator of claim 16, wherein the at least one pullup circuit is a pullup resistor, a transistor or a current source.

18. The multiphase voltage regulator of claim 16, further comprising a switch coupled to the at least one pullup circuit and configured to disconnect the at least one pullup circuit from the current sense interface when the multiphase voltage regulator is regulating the output voltage provided to the load.

19. The multiphase voltage regulator of claim 18, wherein the controller is configured to ignore voltage measurements taken from the current sense interface when the at least one pullup circuit is enabled by the switches and the multiphase voltage regulator is regulating the output voltage provided to the load.

20. The multiphase voltage regulator of claim 1, wherein the fault detection circuit comprises a comparator circuit configured to compare voltage measurements taken over the current sense interface to a threshold detection voltage to determine if an individual one of the current sense interface lines has an open fault.

21. The multiphase voltage regulator of claim 1, wherein the controller comprises an ADC (analog-to-digital voltage regulator) configured to convert analog voltage measurements over the current sense interface to corresponding digital values, and wherein the fault detection circuit is configured to determine if an individual one of the current sense interface lines has an open fault based on whether the digital values fall outside a predetermined range.

22. The multiphase voltage regulator of claim 1, wherein the fault detection circuit is configured to determine if an individual one of the current sense interface lines has an open fault during a startup mode of the multiphase voltage regulator.

23. The multiphase voltage regulator of claim 1, wherein the multiphase voltage regulator is configured to begin regulating the output voltage provided to the load after exiting a startup mode and after responding to a voltage regulator enable signal received by the multiphase voltage regulator, and wherein the fault detection circuit is configured to determine if an individual one of the current sense interface lines has an open fault after the multiphase voltage regulator exits the startup mode and before the multiphase voltage regulator responds to the voltage regulator enable signal.

24. The multiphase voltage regulator of claim 1, wherein in response to the fault detection circuit detecting that an individual one of the current sense interface lines has an open fault, the controller is configured to at least one of:
set a fault in a status register;
emulate or zero the phase current of the power stage for which an open fault has been detected on a corresponding current sense interface line;
disable the power stage for which an open fault has been detected on the corresponding current sense interface line, while continuing to regulate the output voltage provided to the load through the other power stages; and
shut down the controller.

25. A method of operating a multiphase voltage regulator having a plurality of power stages each configured to deliver a phase current to a load, a plurality of current sense circuits each configured to provide a current sense signal representative of the phase current delivered to the load by the power stage coupled to the current sense circuit, and a current sense interface running between a controller and one or more of the current sense circuits, the current sense interface comprising a separate line for each current sense circuit coupled to the current sense interface and which is configured to support single-ended or differential current sense, the method comprising:
connecting separate pullup circuits to individual ones of the current sense interface lines, each pullup circuit having a higher impedance than the current sense interface line to which the pullup circuit is connected; and
determining if an individual one of the current sense interface lines has an open fault, based on the pullup circuit connected to the line with the open fault pulling up the voltage on the line by more than a predetermined amount.

26. The method of claim 25, further comprising:
disabling at least one of the pullup circuits when the multiphase voltage regulator is regulating an output voltage provided to the load.

27. The method of claim 25, further comprising:
ignoring voltage measurements taken over the current sense interface when at least one of the pullup circuits is enabled and the multiphase voltage regulator is regulating an output voltage provided to the load.

28. The method of claim 25, wherein determining if an individual one of the current sense interface lines has an open fault comprises:
comparing voltage measurements taken over the current sense interface to a threshold detection voltage.

29. The method of claim 25, further comprising:
converting analog voltage measurements taken over the current sense interface to corresponding digital values,
wherein an individual one of the current sense interface lines is determined to have an open fault based on whether the digital values fall outside a predetermined range.

30. The method of claim 25, wherein determining if an individual one of the current sense interface lines has an open fault comprises:
determining if an individual one of the current sense interface lines has an open fault during a startup mode of the multiphase voltage regulator.

31. The method of claim 25, further comprising:
beginning regulation of an output voltage provided to the load after exiting a startup mode and after responding to a voltage regulator enable signal received by the multiphase voltage regulator,
wherein determining if an individual one of the current sense interface lines has an open fault comprises determining if an individual one of the current sense interface lines has an open fault after the multiphase voltage regulator exits the startup mode and before the multiphase voltage regulator responds to the voltage regulator enable signal.

32. The method of claim 25, further comprising:
wherein in response determining that an individual one of the current sense interface lines has an open fault, at least one of:
setting a fault in a status register;
emulating or zeroing the phase current of the power stage for which an open fault has been detected on a corresponding current sense interface line;
disabling the power stage for which an open fault has been detected on the corresponding current sense interface line, while continuing to regulate the output voltage provided to the load through the other power stages; and
shutting down the controller.

* * * * *

UNITED STATES PATENT AND TRADEMARK OFFICE
CERTIFICATE OF CORRECTION

PATENT NO. : 10,693,361 B2
APPLICATION NO. : 16/051762
DATED : June 23, 2020
INVENTOR(S) : J. Guo et al.

Page 1 of 1

It is certified that error appears in the above-identified patent and that said Letters Patent is hereby corrected as shown below:

In the Claims

Column 16, Line 33 (Claim 32, Line 2), please change "response determining" to -- response to determining --.

Signed and Sealed this
Twenty-fifth Day of August, 2020

Andrei Iancu
*Director of the United States Patent and Trademark Office*